(12) United States Patent
Bruckert

(10) Patent No.: US 6,198,748 B1
(45) Date of Patent: Mar. 6, 2001

(54) DATA TRANSMISSION SYSTEM AND METHOD

(75) Inventor: Eugene J. Bruckert, Arlington Heights, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/921,791

(22) Filed: Sep. 2, 1997

(51) Int. Cl.[7] .................................................. H04J 3/26
(52) U.S. Cl. ................................... 370/432; 370/342
(58) Field of Search ............................. 370/209, 320, 370/335, 342, 470, 515, 432; 455/260; 358/143

(56) References Cited

U.S. PATENT DOCUMENTS

| | | | |
|---|---|---|---|
| 4,559,625 | * | 12/1985 | Berlekamp et al. ................ 371/1 |
| 5,502,734 | * | 3/1996 | Kashida ................ 371/37.4 |
| 5,764,690 | * | 12/1985 | Blanchard et al. ................ 375/206 |

* cited by examiner

*Primary Examiner*—Huy D. Vu
*Assistant Examiner*—Alexander O. Boakye
(74) *Attorney, Agent, or Firm*—Kenneth A. Haas

(57) ABSTRACT

A data transmission system identifies the length of communicated messages and adjusts interleave depth in response to the length of the communicated message. The system provides an efficient method of interleaving both voice data typically having a long message length and packet data typically having a short length.

25 Claims, 3 Drawing Sheets

IN:     (f1, b1), (f1, b2), (f1, b3), ..., (Fj, b1), (Fj, b2), (Fj, b3), ...
INSERT: (s, b1), (c, b2), (f1, b3), ...,(Fj, b1), ..., (s, b2), (c, b2), (f1, b4), ...
OUT:    (s, b1), (s, b2), ..., (c, b2), (c, b3), ..., (f1, b3), ...

FIG.4

|     | −1  | 0   | 1   | 2      | 3      | 4      | 5      | 6      | 7      | 8      | 9      |
| --- | --- | --- | --- | ------ | ------ | ------ | ------ | ------ | ------ | ------ | ------ |
| −1  |     | c2  |     |        |        |        |        |        |        |        |        |
| 0   |     | c3  | c2  |        |        |        |        |        |        |        |        |
| 1   |     | c4  | c3  | b(2,1) |        |        |        |        |        |        |        |
| 2   |     | c5  | c4  | b(2,1) | b(1,1) |        |        |        |        |        |        |
| 3   |     | c6  | c5  | b(2,2) | b(1,2) | b(1,3) |        |        |        |        |        |
| 4   |     | c7  | c6  | b(1,4) | b(1,5) | b(1,6) | b(1,7) |        |        |        |        |
| 5   |     | c8  | c7  | b(1,8) | b(1,9) | b(1,1) | b(1,2) | b(1,3) |        |        |        |
| 6   | c1  | c9  | c8  | b(1,4) | b(1,5) | b(1,6) | b(1,7) | b(1,8) | b(1,9) |        |        |
| 7   |     | c1  | c9  | b(2,3) | b(2,4) | b(2,5) | b(2,6) | b(2,7) | b(2,8) | b(2,9) |        |
| 8   |     |     | b(3,1) | b(3,2) | b(3,3) | b(3,4) | b(3,5) | b(3,6) | b(3,7) | b(3,8) | b(3,9) |
| 9   |     |     | b(4,1) ... |    |        |        |        |        |        |        |        |

DATA TRANSMISSION SYSTEM AND METHOD

FIELD OF THE INVENTION

The present invention relates generally to data communication, and more particularly, to a data transmission system and method for efficiently transmitting short messages while concomitantly taking advantage of increased sensitivity provided by long interleave spans.

BACKGROUND OF THE INVENTION

The goal of any communication system is the error free transmission of the communicated signal whether it be an analog signal, a coded analog signal, or coded data. Communication systems adapted for transmission of coded information (voice and/or data) generally include some form of error correction. Error correction in these systems frequently takes the form of error detection and correction software. That is, software adapted to detect errors in the coded information and based upon a set of correction parameters replace the errors with an estimation of the correct coded information. These and other types of error correction mechanisms typically rely on prediction, interpolation and other similar techniques which generate an estimation of the corrupted coded information from preceding and succeeding bits of coded information.

Many modern communication systems incorporate a wireless, or air interface, for transmitting coded information from a base station to a mobile station. In these types of communication systems bursty errors, due, for example, to fading, interference or other disruptions to the coded information as it is transmitted over the air interface, may cause errors in blocks of bits. Errors in blocks of bits are difficult to correct using error correcting code because of the lack of surrounding information from which to estimate the correct information.

A solution is to provide as much diversity in the air interface as possible to achieve acceptable levels of communication quality in terms of data error rate. A common technique for introducing diversity into the air interface is interleaving the bits of coded information over many transmitted frames. Interleaving, in addition to error correction, works very well especially where fading is experienced by scattering the errors that would otherwise wipe out an entire frame of coded information among many frames.

There are two common methods of interleaving. The first is so-called block interleaving wherein the symbols (bits of coded information) of an RF transmit frame are read into a matrix one way and read out for transmission in a different way. For example, the data is read into the matrix by rows and read out of the matrix by columns. The next frame is then read into the matrix and the process repeated. This is the method according to the IS-95 standard where the 456 symbols of a 20 millisecond (ms) frame are interleaved prior to transmission.

A second method is so-called diagonal interleaving wherein groups of bits are spread over the entire interleave depth in a staggered way. Interleave depth refers to the number of frames of coded information over which all of the symbols of a single frame are spread for transmission. Likewise interleave depth refers to the number of frames of transmitted information which need to be recovered in order to properly decode a single frame of information. In diagonal interleave, the symbols are read into a staggered matrix, with each succeeding row/column incrementing one column/row, respectively, as the case may be. This is the GSM method of interleaving where a frame is spread over 4.5 frames after interleaving.

With any type of interleaving, longer interleave depth benefits error protection by spreading bit errors over a large number of frames thereby decreasing noise correlation and increasing sensitivity. However, longer interleave depth requires longer data recovery times since a larger number of frames have to be recovered to decode a single frame of data. With short messages, such as messages in a packet data network which are often less than a single frame in length, long interleave depth is an inefficient process. In GSM, for example, a packet date message occupying a fraction of a data frame could require 4.5 frames worth of transmission time. In certain applications, interleave depth is limited by the amount of transmission delay which can be tolerated. For example, in the transmission of coded voice information the maximum practical delay is approximately 20 ms.

U.S. Pat. No. 4,901,319 to Ross teaches a method of interleaving in which the interleave depth is adapted based upon a fading characteristic of the radio channel. In this regard, fading characteristics of the channel are measured, and an interleave depth having the minimum time span necessary to provide good error correction in view of the fading characteristic is employed. The disadvantage of Ross, however, is that the length of the information being interleaved is not considered in selecting interleave depth. Hence, with very short messages, once again such a packet data, the interleave depth may be unnecessarily long.

Thus there remains a need for a data transmission system and method which efficiently transmits short messages yet takes advantage of the increased sensitivity of long interleave depths for long messages.

BRIEF DESCRIPTION OF THE DRAWING

FIG. 4 is a chart illustrating a block diagonal interleave arrangement in accordance with a preferred embodiment of the present invention; and FIG. 5 is a chart illustrating a diagonal interleave arrangement in accordance with another preferred embodiment of the present invention.

DETAILED DESCRIPTION OF THE PREFERRED EMBODIMENTS

The present invention will be described in terms of several preferred embodiments of a mobile radiotelephone communication system adapted for transmission of packet data. It will be appreciated that other embodiments of the present invention may be implemented without departing from its fair scope.

Figure 1:
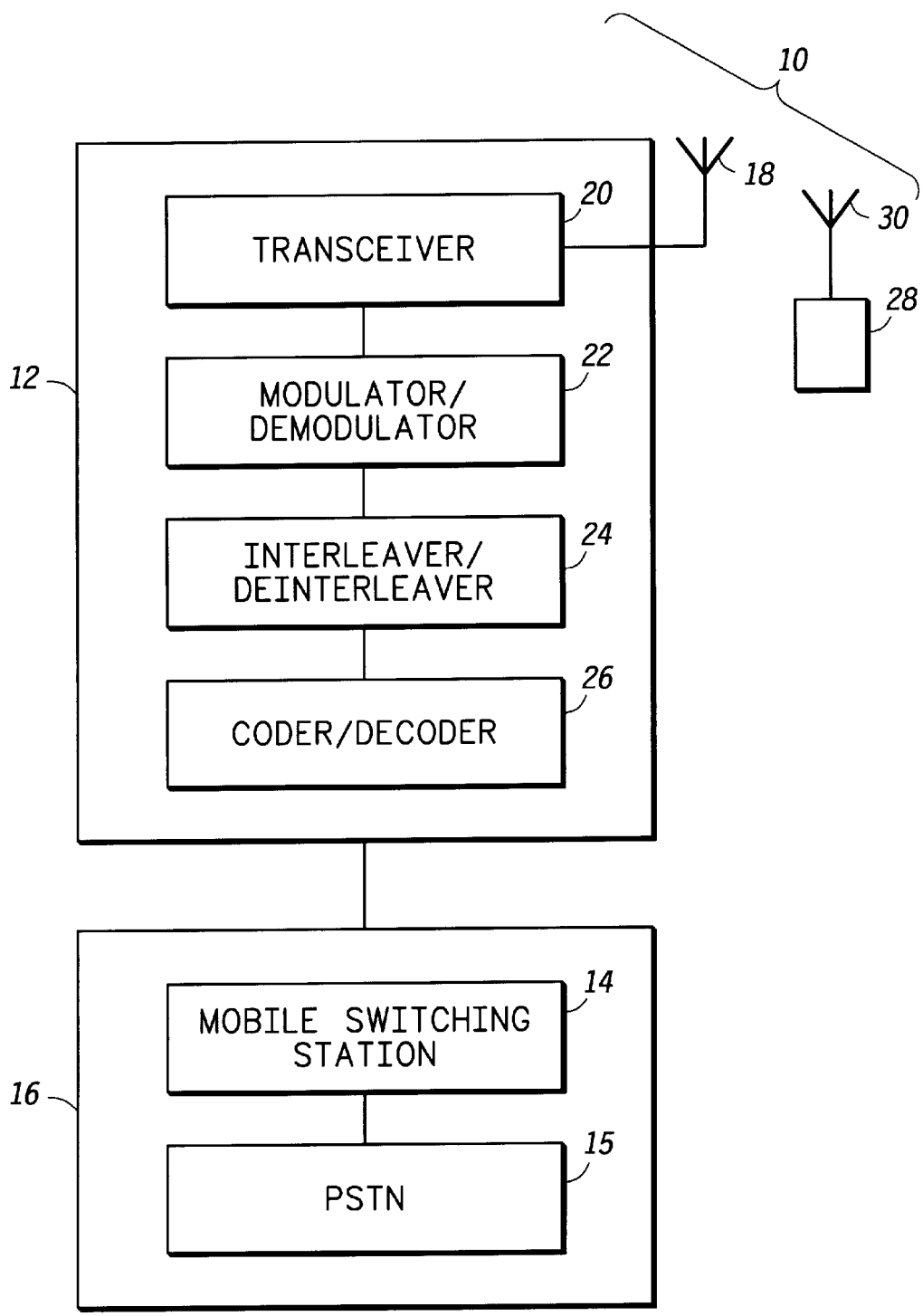
FIG. 1 is a schematic illustration of a communication system in accordance with a preferred embodiment of the present invention.

Referring then to FIG. 1, a mobile radiotelephone communication system 10 includes a base station 12 coupled to a mobile switching center 14 and/or a land based communication system (or public switched telephone network, PSTN) 15 collectively referred to herein as network 16. Base station 12 includes antenna 18, transceiver 20, modulator/demodulator 22, interleaver/deinterleaver 24, and coder/decoder 26. As is known, base station 12 sends and receives communication signals between itself and network 16 and sends and receives communication signals, via an air interface, between itself and one or more mobile stations (generally indicated as 28). It will be appreciated that the air interface may be in accordance with any of the generally know standards such as GSM or IS-95. Each mobile station 28 includes an antenna 30, transceiver, modulator/demodulator and interleaver/deinterleaver (not shown) as is well know in the art, for communicating in accordance with the air interface standard with base station 12.

In accordance with a preferred embodiment of the present invention, communication 10 is operable for communicating both coded voice information and coded data or packet data to mobile stations 28. In this regard, base station 12 receives voice and/or data information from network 16 for communication to one or several of the mobile stations 28. The information is coded in accordance with the applicable communication standard via coder/decoder 26 and interleaved via interleaver/deinterleaver 24. The interleaved information is then modulated via modulator/demodulator 22 and transmitted to one or more of the mobile stations via transceiver 20 and antenna 18. It will be appreciated that at mobile station 28 the transmitted information is received and demodulated, deinterleaved and decoded. It will be similarly appreciated that mobile station 28 is operable to code, interleave, modulate and transmit information to base station 12 which is operable to demodulate, deinterleave and decode the information.

Figure 2:
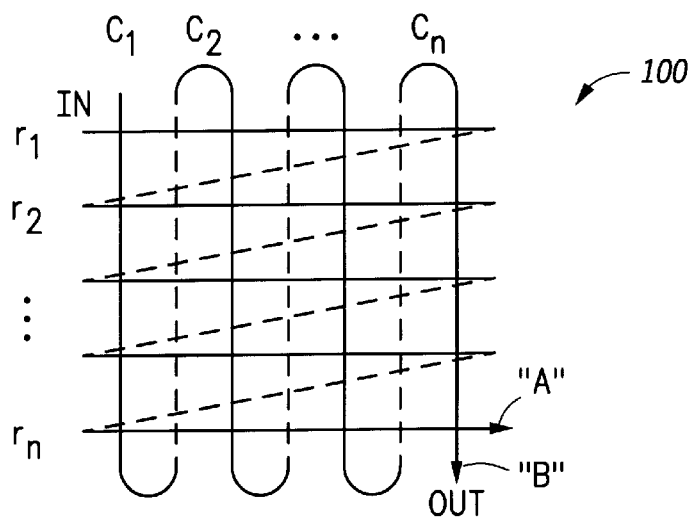
FIG. 2 is a diagram illustrating block interleave generally.
Figure 3:
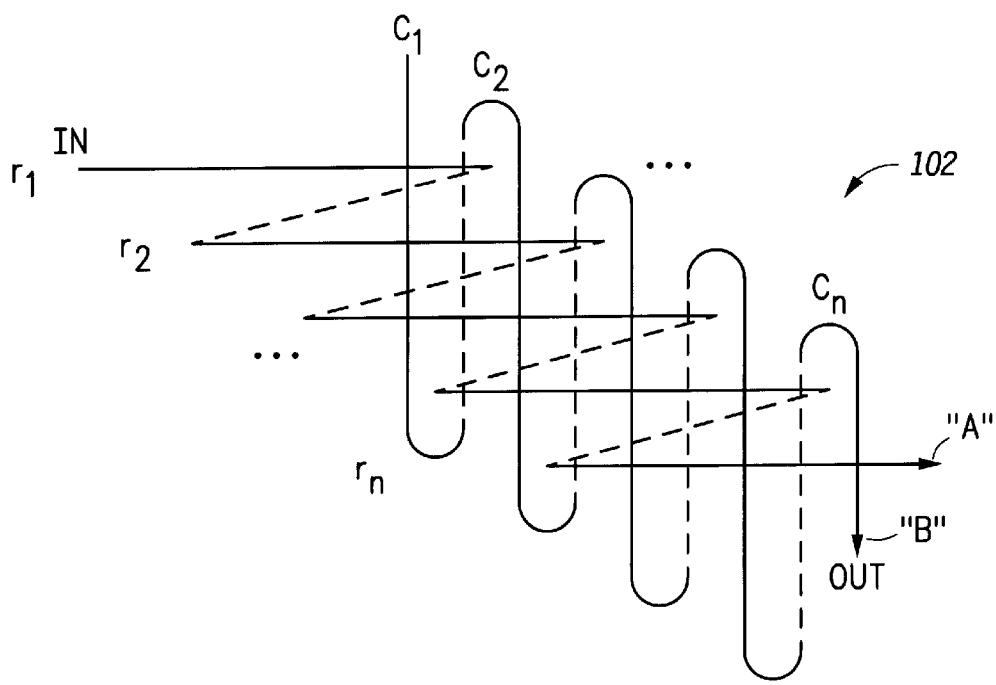
FIG. 3 is a diagram illustrating diagonal interleave generally.

Referring then to FIGS. 2 and 3, two forms of interleaving are shown. FIG. 2 illustrates so-called block interleave. A plurality of rows r1, r2, . . . , rn and columns, c1, c2, . . . , cn form interleave matrix 100. During the interleave process, coded information, whether voice or data, is read into matrix 100. That is, the coded information is arranged into frames having a predetermined length and including a plurality of bits as specified in the applicable standard. Matrix 100 fills with frames row by row with bits occupying each row and column entry of a row before indexing to the next row. This process is generally illustrated by arrow "A" (the phantom indicator referencing the indexing step). The bits of information are then read out of matrix 100 column by column with bits taken from each row and column entry of a column before indexing to the next column. This process is generally illustrated by arrow "B" (the phantom indicator referencing the indexing step).

FIG. 3 illustrates so-called diagonal interleave. As shown in FIG. 3 rows r1, r2, . . . , rn and column are offset, indexing one column/row, respectively, to form interleave matrix 102. Matrix 102 fills with frames row by row with bits occupying each row and column entry of a row before indexing to the next, offset row. This process is generally illustrated by arrow "A" (the phantom indicator referencing the indexing step). The bits of information are then read out of matrix 102 column by column with bits taken from each row and column entry of a column before indexing to the next, offset column. This process is generally illustrated by arrow "B" (the phantom indicator referencing the indexing step). It will be appreciated that to conserve memory block diagonal interleave may be employed. For block diagonal interleave, the bits of each frame are scrambled and the frame is divided into a number of contiguous blocks. Each block is transmitted as a group. In this case, the blocks are read into and then out of interleave matrix 102 as described.

The number of frames required to fill interleave matrices 100 or 102 establishes the interleave depth. That is, the number of frames interleaved prior to modulation and transmission of the coded information. For large amounts of information, such as coded voice, it is desirable to interleave to as long a depth as possible without introducing significant transmission delay. It should be recalled that for deeper interleave several frames of information are required to be received and deinterleaved in order to recover a single frame of information hence introducing transmission delay. For shorter messages, such as packet data messages which may occupy less than a frame, a short interleave depth is desirable to speed transmission.

In accordance with a preferred embodiment of the present invention, interleaver/deinterleaver 24 is operable to determine a message length and to establish an interleave depth in relation to the message length. The interleave depth is preferably a depth from one to a specified number of frames as governed by an acceptable amount of transmission delay and/or by the communication standard. In a transmit mode, interleaver/deinterleaver 24 receives coded information from coder/decoder 22, spans the information to determine an adapted interleave depth, interleaves the coded information to the adapted interleave depth established in relation to the message length and communicates the interleaved information to modulator/demodulator 26 and transceiver 28 for transmission.

In a receive mode, interleaver/deinterleaver 24 receives information interleaved to an adapted depth from modulator/demodulator 26, determines the adapted interleave depth, deinterleaves the information and communicates the deinterleaved information to coder/decoder 24.

Interleaver/deinterleaver 24 may be adapted to actually determine the message length prior to determining the interleave depth. However, the message length may be advantageously communicated to interleaver/deinterleaver 24. In a preferred embodiment, a four (4) bit field of a control message can be sent as part of the communication initialization (often referred to as call set-up for mobile radiotelephone systems) giving the length of the message. In addition, the message length may be made part of a data block transmitted with the interleaved data. It is important to note, however, that this data block must be capable of being processed without deinterleaving.

In another preferred embodiment, base station 12 and mobile station 28 begin a communication session utilizing a modest diagonal interleave depth or none at all. As the communication session continues, the interleave depth is adaptively altered as the communicated message progresses. Control messaging, present during the communication session in any event, may be advantageously employed to indicate the present depth of interleave.

Utilizing diagonal interleave creates some inefficiency in that an amount of dead time, or an unused portion of the transmission slot, is present at the beginning and end of the interleaved message. Typically, it is necessary to fill the dead time with dummy information at least at the beginning of the message. In an N frame diagonal interleave, there are approximately N/2 frames of dead time at the beginning and end of each communication session.

In accordance with a preferred embodiment, the dead time is filled with one of control messaging, synchronization messaging or stuffed traffic channel frames (frames of the message being communicated). The dead space at the beginning of a message will be typically filled while the dead space at the end may be left alone. Referring to FIG. 4, the first blocks of the jth and kth traffic frames are used to stuff in synchronization, control and/or other traffic channel messages. The stuffed frames may be sent at a lower transmission rate, such as through repeated transmission, to make up for sensitivity loss. FIG. 4, illustrates the normally interleaved traffic frames "In", the inserted message "insert" and the output "out" of interleaver/deinterleave 24. Synchronization frames are shown as "s", control frames are shown as "c", stuffed traffic frames are shown as (f1, f2, ..., fk) and normally interleaved traffic frames are shown as (F1, F2, ...).

FIG. 5 illustrates an alternative implementation of the present invention satisfying the following conditions: synchronization frames are not required, control frames are transmitted at half rate and must be completed before traffic frames are transmitted, block stuffing of the first traffic channel frames is employed, stuffing is employed only at the beginning of communication session and the traffic frames must be 8:1 interleaved. FIG. 5 shows one control message (c1, c2, ..., cn) and one stuffing frame. The blocks are read into interleave matrix 104 from left to right and read out from top to bottom where bit(x,y) is bit y of the xth frame. Typically, interleaving can only improve performance of a fading channel to that of the non-fading channel. For IS-95 code division multiple access (CDMA) this is about 3 decibels (dB). Thus, the reason for halving the effective control channel rate. It can be seen that the stuffed traffic frames are triangular interleaved which reduces sensitivity which may require additional action, such as repeated transmission, to maintain performance. Also, it will be noted that the traffic frames must be able to be segmented into 9 blocks to achieve the 8:1 interleave. All frame lengths preclude certain dividers so in practice the actual interleave depth is quantized. As can be seen in FIG. 5, the first two block slots of the second frame are "stolen" by the control message which starts at an offset position in order to minimize the number of stuffed frames. The stolen blocks are stuffed into the dead space interval with the first block repeated but not the second. In this case there is a slight transmission penalty associated with the second block having slightly poorer performance.

In another embodiment of the present invention, base station 12 is operable to determine the speed of mobile station 28 with respect to base station 12. Several methods of determining the speed of mobile station 28 are known in the art and any suitable method may be employed. Interleaver/deinterleaver 24 determines an interleave depth in relation to both the message length and the speed of mobile station 28. In this regard, increased sensitivity due to decreased mobile station speed may be advantageously leveraged to reduce transmission time by shortening interleave depth. In this regard, it will be appreciated that interleaver/deinterleaver 24 may be adapted to be responsive to any number of parameters indicative to the system sensitivity to either maximize sensitivity or minimize transmission time by adaptively adjusting interleave depth.

The invention disclosed herein has been described in terms of several preferred implementations including, without limitation, in terms of a data transmission system including adaptive interleave and in terms of a method for transmitting data. It will be readily appreciated that other implementations, adaptations and embodiments are possible without departing from the fair scope of the invention.

What is claimed is:

1. A method of transmitting coded data information comprising the steps of:

receiving coded information as part of a communicated message;

determining a length of the coded information;

establishing an interleave depth in proportion to the length;

interleaving the coded information in accordance with the interleave depth;

transmitting the interleaved coded information;

receiving second coded information as part of the communicated message;

determining a second length of the coded information;

adaptively altering the interleave depth in proportion to the second length; and transmitting the interleaved second coded information.

2. The method of claim 1 wherein the coded information comprises at least one of coded voice information and packet data.

3. The method of claim 1 wherein the interleave depth is limited to a maximum.

4. The method of claim 1 wherein the step of determining a length comprises referencing one of a control message, and a first frame of coded information.

5. The method of claim 1 wherein the step of establishing an interleave depth further comprises establishing the interleave depth in response to a mobile station speed.

6. The method of claim 1 wherein the step of interleaving the frame of coded data comprises interleaving the frame of coded data according to one of: a block interleave and a diagonal interleave.

7. The method of claim 1 further comprising:

receiving the interleaved coded information;

determining the interleave depth; and deinterleaving the coded information.

8. The method of claim 1 wherein the coded information is organized into frames, and the step of interleaving the coded information comprises interleaving the frames.

9. The method of claim 8 further comprising:

identifying the presence of at least one empty frame associated with the interleaved frame of coded data; and filling the at least one empty frame with one of: additional frames of coded data, a synchronization data frame and a control data frame.

10. The method of claim 9 wherein the step of identifying the presence of at least one empty frame comprises identifying the presence of at least one empty frame at a beginning of the interleaved frame of coded data.

11. A data transmission system comprising:

a transceiver adapted to transmit and receive coded information; and an interleaver/deinterleaver coupled to the transceiver, the interleaver/deinterleaver adapted to:

receiving coded information as part of a communicated message;

determining a length of the coded information;

establishing an interleave depth in proportion to the length;

interleaving the coded information in accordance with the interleave depth;

transmitting the interleaved coded information;

receiving second coded information as part of the communicated message;

determining a second length of the coded information;

adaptively altering the interleave depth in proportion to the second length; and transmitting the interleaved second coded information.

12. The data transmission system of claim 11 wherein the coded information comprises a length of coded information message.

13. The data transmission system of claim 11 wherein the coded information comprises at least one of coded voice information and packet data.

14. The data transmission system of claim 11 wherein the coded information comprises a mobile speed indication and wherein the interleaver/deinterleaver is adapted to interleave the coded information in accordance with the length of the coded information and the mobile speed indication.

15. The data transmission system of claim 11 wherein the coded information is organized into a plurality of frames and wherein the interleaver/deinterleaver is adapted to interleave the frames of coded information.

16. The data transmission system of claim 11 wherein the interleaved coded information comprises at least one stuffed frame of information.

17. The data transmission system of claim 16 wherein the stuffed frame of information comprises one of: a control message, a synchronization message and a traffic channel frame.

18. The data transmission system of claim 11 wherein the interleaved coded information comprises one of block interleaved coded information and diagonal interleaved coded information.

19. An apparatus for transmitting coded data comprising
   means for receiving coded information as part of a communicated message;
   means for determining a length of the coded information;
   means for establishing an interleave depth in proportion to the length;
   means for interleaving the coded information in accordance with the interleave depth;
   means for transmitting the interleaved coded information;
   means for receiving second coded information as part of the communicated message;
   means for determining a second length of the coded information;
   means for adaptively altering the interleave depth in proportion to the second length; and
   means for transmitting the interleaved second coded information.

20. The apparatus of claim 19 wherein the coded information comprises at least one of coded voice information and packet data.

21. The apparatus of claim 19 wherein the coded information comprises a plurality of frames and wherein the means for interleaving the coded message is operable to interleave the frames.

22. The apparatus of claim 19 wherein the coded information comprises a speed of mobile station indicator and wherein the means for interleaving the coded message in accordance with the length is operable to interleave the coded message in accordance with the length and the speed of mobile station indicator.

23. The apparatus of claim 19 wherein the interleaved coded information comprises at least one of a block interleaved coded message and a diagonal interleaved coded message.

24. The apparatus of claim 19 further comprises means for locating at least one null space of the interleaved coded information and means for inserting stuffing information in the null space.

25. The apparatus of claim 24 wherein the stuffing information comprises at least one of: a control message, a synchronization message and a traffic channel message.

* * * * *